(12) United States Patent
Takagi

(10) Patent No.: US 7,741,907 B2
(45) Date of Patent: Jun. 22, 2010

(54) CLASS-F POWER AMPLIFIER CIRCUIT

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 12/061,215

(22) Filed: Apr. 2, 2008

(65) Prior Publication Data
US 2008/0252382 A1    Oct. 16, 2008

(30) Foreign Application Priority Data
Apr. 12, 2007    (JP) .................. P2007-105095

(51) Int. Cl.
*H03F 3/217*    (2006.01)
*H03F 3/191*    (2006.01)

(52) U.S. Cl. ....................... 330/251; 330/302
(58) Field of Classification Search .............. 330/251, 330/302, 306
See application file for complete search history.

(56) References Cited

U.S. PATENT DOCUMENTS

| | | |
|---|---|---|
| 4,717,884 A | 1/1988 | Mitzlaff |
| 5,146,178 A * | 9/1992 | Nojima et al. ............ 330/251 |
| 7,161,434 B2 | 1/2007 | Rhodes |
| 2007/0057731 A1 * | 3/2007 | Le ................................ 330/302 |

FOREIGN PATENT DOCUMENTS

| | | |
|---|---|---|
| JP | 2001-111362 | 4/2001 |
| JP | 2005-117200 | 4/2005 |
| WO | WO 02/31966 A2 | 4/2002 |
| WO | WO 2004/023646 A1 | 3/2004 |
| WO | WO 2006/016299 A1 | 2/2006 |

* cited by examiner

*Primary Examiner*—Steven J Mottola
(74) *Attorney, Agent, or Firm*—Oblon, Spivak, McClelland, Maier & Neustadt, L.L.P.

(57) ABSTRACT

An FET outputs a signal including a component of angular frequency $\omega o$ of input signal and harmonic components, a first two-terminal reactance circuit interconnects an output terminal and a ground terminal of the FET, a fundamental matching circuit is connected to an output terminal end of the FET, a second two-terminal reactance circuit is connected between an input terminal of the matching circuit and the output terminal, the FET has a parallel circuit of an output resistor and an output capacitor, the first two-terminal reactance circuit is open for a dc, shorted for angular frequencies $2\omega o, 4\omega o, \ldots, 2n\omega o$, and parallel resonant with the output capacitor for angular frequencies $3\omega o, 5\omega o, \ldots, (2n+1)\omega o$, and the second two-terminal reactance circuit is shorted for a dc, and open for angular frequencies $3\omega o, 5\omega o, \ldots, (2n+1)\omega o$.

15 Claims, 5 Drawing Sheets

CLASS-F POWER AMPLIFIER CIRCUIT

CROSS REFERENCE TO RELATED APPLICATION AND INCORPORATION BY REFERENCE

This application is based upon and claims the benefit of priority from prior Japanese Patent Application No. P2007-105095 filed on Apr. 12, 2007, the entire contents of which are incorporated herein by reference.

BACKGROUND OF THE INVENTION

1. Field of the Invention

The present invention relates to a class-F amplifier, and particularly, to a class-F amplifier of a high-frequency semiconductor device of class-F operation allowing the impedance, as it is seen from an amplifying element with a load inclusive, to be matched for a fundamental wave, shorted for even harmonics, and open for odd harmonics.

2. Description of the Related Art

Recent years have observed high-frequency operable transistors in practical use, such as HEMT (High Electron Mobility Transistor), HBT (Hetero-junction Bipolar Transistor), etc. Those devices implement operation frequencies within a band of 50 to 60 GHz.

Some of them make positive use of harmonics to allow for an enhanced gain, where desirable for enhanced power efficiency is controlled power consumption by harmonics.

For such a purpose so-called class-F amplifiers are used. For class-F amplifiers, the principle is to have a combination of instantaneous voltage waveform and instantaneous current waveform kept anytime from overlapping each other.

It therefore is necessary for a transistor to have an impedance seen from an output terminal thereof with the load side inclusive to be shorted for even harmonics, and open for odd harmonics. The transistor is thereby allowed for the current through the output terminal to have frequency components consisting simply of a fundamental and even harmonics, and for the voltage thereacross to have frequency components consisting simply of odd harmonics, with a nullified power loss due to harmonics. If the phase of a current in the fundamental is quite opposite to the voltage, dc power may be converted into microwave power with a 100% efficiency.

There has been disclosed in patent document 1 below, as well as patent document 2 below, a class-F amplifier in which the impedance seen from an amplifying element with a load inclusive is not simply matched for a fundamental wave, but also shorted for even harmonics and rendered open for odd harmonics, for the high frequency power amplifier to be enhanced in efficiency.

However, assuming the amplifying element to be an FET (Field Effect Transistor) of an internally matched FET model that has a dc bias Vdd supplied to the drain from an RF output terminal of an enclosure, for example, if it has built in a harmonic processor composed of a distributed constant circuit, as disclosed in patent document 1, then the distributed constant circuit might have an increased area, with a resultant increase in area of the enclosure.

On the other hand, as disclosed in patent document 2, one may employ a downsized harmonic processor composed of a lumped constant circuit to be open for a dc, and set in such a system that has a direct dc bias supplied to the drain of an FET via a choke coil separated from the harmonic processor, and is inapplicable to a high power internally matched FET having a dc bias supplied from an RF output terminal.

Both cases have an impedance seen from the drain of an FET, with a load inclusive, set open for odd harmonics, and would work for a class-F operation at frequencies where the output capacity of FET is negligible, but would not at high frequencies where the output capacity of FET is unnegligible.

Patent document 1:
Japanese Patent Application Laying-Open Publication No. 2001-111362
Patent document 2:
Japanese Patent Application Laying-Open Publication No. 2005-117200

SUMMARY OF THE INVENTION

According to an aspect of the invention, a class-F amplifier includes an amplifying element configured to output an output signal including a component of an angular frequency $\omega o$ of an input signal, and harmonic components thereof, a first reactance circuit interconnecting an output terminal and a ground terminal of the amplifying element, a fundamental matching circuit disposed at an output terminal end of the amplifying element, a second reactance circuit connected between an input terminal of the fundamental matching circuit and the output terminal of the amplifying element, and a load interconnecting an output terminal of the fundamental matching circuit and a ground terminal, the amplifying element has as an output impedance thereof an impedance of a parallel circuit comprising an output resistor and an output capacitor, the first reactance circuit is configured to be open for a dc component, shorted for components of angular frequencies $2\omega o, 4\omega o, \ldots, 2n\omega o$, where n is an arbitrary integer of 1 or more, and parallel resonant with the output capacitor of the amplifying element for components of angular frequencies $3\omega o, 5\omega o, \ldots, (2n+1)(\omega o$, and the second reactance circuit is configured to be shorted for a dc component, and open for components of angular frequencies $3\omega o, 5\omega o, \ldots, (2n+1)\omega o$.

According to the aspect of the invention, a class-F amplifier is adapted for a dc bias to be supplied from an RF output terminal, allowing for a downsizing, a high efficiency, and a class-F operation even at high frequencies where the output capacity of FET is unnegligible.

DETAILED DESCRIPTION OF THE EMBODIMENTS

Figure 1:
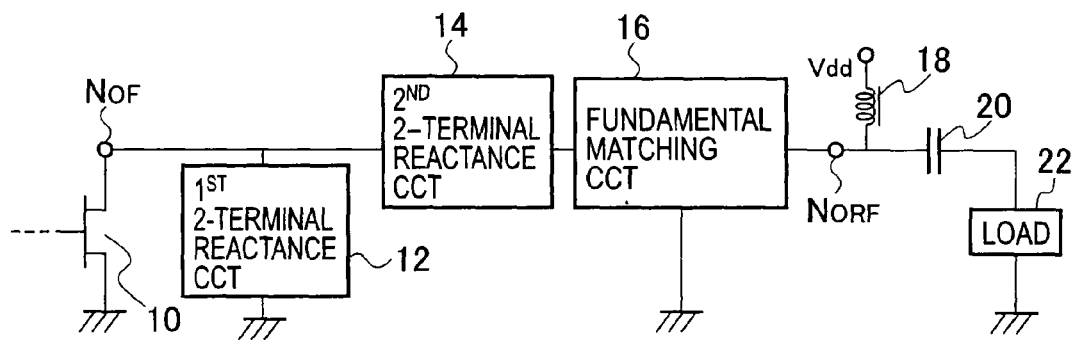
FIG. 1 is a schematic circuit diagram of a class-F amplifier according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

First Embodiment

Figure 2:
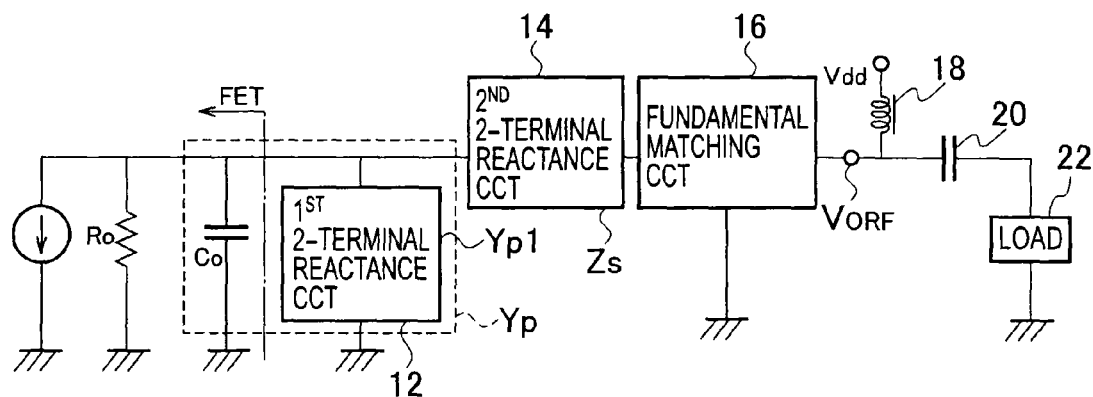
FIG. 2 is a schematic equivalent circuit connection diagram of the class-F amplifier according to the first embodiment.

FIG. 1 is a schematic circuit diagram of a class-F amplifier according to a first embodiment of the present invention, and FIG. 2, a schematic equivalent circuit connection diagram of the class-F amplifier according to the first embodiment.

As illustrated in FIGS. 1 and 2, the class-F amplifier according to the first embodiment includes: an FET 10 as an amplifying element configured to output an output signal including a component of an angular frequency $\omega o$ of an input signal, and harmonic components thereof; a first two-terminal reactance circuit 12 interconnecting an output terminal $N_{OF}$ and a ground terminal of the FET 10; a fundamental matching circuit 16 connected to an RF (high frequency) output terminal $N_{ORF}$; a second two-terminal reactance circuit 14 connected in series between the output terminal $N_{OF}$ of the FET 10 and the RF output terminal $N_{ORF}$, interconnecting the output terminal $N_{OF}$ of the FET 10 and an input terminal of the fundamental matching circuit 16; and a load 22 interconnecting an output terminal of the fundamental matching circuit 16 and a ground terminal.

The FET 10 has as its output impedance an impedance of a parallel circuit composed of an output resistor Ro and an output capacitor Co. The first two-terminal reactance circuit 12 is configured to be open for a dc component, shorted for components of angular frequencies $2\omega o, 4\omega o, \ldots, 2n\omega o$, where n is an arbitrary integer of 1 or more, and parallel resonant with the output capacitor Co of the FET 10 for components of angular frequencies $3\omega o, 5\omega o, \ldots, (2n+1)\omega o$. The second two-terminal reactance circuit 14 is configured to be shorted for a dc component, and open for components of angular frequencies $3\omega o, 5\omega o, \ldots, (2n+1)\omega o$.

A drain of the FET 10 is connected to the output terminal $N_{OF}$ of the FET 10. The first two-terminal reactance circuit 12 interconnects the drain and the ground terminal, and the second two-terminal reactance circuit 14 interconnects the drain and the input terminal of the fundamental matching circuit 16. The fundamental matching circuit 16 has the RF output terminal $N_{ORF}$ as its output terminal, and combination of a choke coil 18 and a dc cutting capacitor 20 is inserted between the RF output terminal $N_{ORF}$ and the load 22. The fundamental matching circuit 16 may be removed at least in part to the load 22.

In configuration of FIG. 2, where the FET 10 has as its output impedance an impedance of the parallel circuit of the output resistor Ro and the output capacitor Co, this output capacitor Co is connected in parallel with the first two-terminal reactance circuit 12, constituting a circuit having an admittance Yp(s) to be open for a dc, shorted for angular frequencies $2\omega o, 4\omega o, \ldots, 2n\omega o$, and open for angular frequencies $3\omega o, 5\omega o, \ldots, (2n+1)\omega o$, such that:

[MATH 1]

$$Yp(s) = Hp \cdot \frac{s \cdot \{s^2 + (3\omega o)^2\} \cdot \{s^2 + (5\omega o)^2\} \ldots [s^2 + \{(2n+1)\omega o\}^2]}{\{s^2 + (2\omega o)^2\} \cdot \{s^2 + (4\omega o)^2\} \ldots \{s^2 + (2n\omega o)^2\}} \quad (1)$$

The FET 10 to be high power has an output impedance $\{1/(1/Ro+j\omega o Co)\}$ as a lower impedance than the load 22, which narrows the bandwidth for the angular frequency $\omega o$ of fundamental wave to be matched, if the output capacity Co is great. To keep the bandwidth from getting narrower, the admittance Yp(s) is conditioned, in its partial fraction development:

[MATH 2]

$$Yp(s) = Hp \cdot s + Yp1(s) \quad (2)$$

such that:

[MATH 3]

$$Hp = Co \quad (3)$$

It is noted that in the right side of expression (2) the second term Yp1(s) represents an admittance of the first two-terminal reactance circuit 12. This two-terminal reactance circuit 12 gets parallel resonant with the output capacitor Co of the FET 10 for odd harmonics, permitting the impedance seen from the output resistor Ro with the load 22 inclusive to be open for odd harmonics, thus allowing for a class-F operation even at high frequencies where the output capacitor Co of the FET 10 is unnegligible.

On the other hand, the second two-terminal reactance circuit 14 has an impedance Zs(s) to be shorted for a dc, and open for angular frequencies $3\omega o, 5\omega o, \ldots, (2n+1)\omega o$. Foster's reactance theory teaches a short to occur between $3\omega o$ and $5\omega o$, $5\omega o$ and $7\omega o$, $\ldots$, and $(2n-1)\omega o$ and $(2n+1)\omega o$. Frequencies for the short to occur can be set voluntarily. For a good symmetry of higher and lower ranges of angular frequencies $3\omega o, 5\omega o, \ldots, (2n+1)\omega o$ for an open, the case of claim 8 is set to be shorted: for a dc only for n=1; for a dc and an angular frequency $4\omega o$ for n=2; and for a dc and angular frequencies $4\omega o, 6\omega o, \ldots, 2n\omega o$ for n=n, and it so follows that:

[MATH 4]

$$Zs(s) = Hs \cdot \frac{s \cdot \{s^2 + (4\omega o)^2\} \cdot \{s^2 + (6\omega o)^2\} \ldots \{s^2 + (m\omega o)^2\}}{\{s^2 + (3\omega o)^2\} \cdot \{s^2 + (5\omega o)^2\} \ldots [s^2 + \{(2n+1)\omega o\}^2]} \quad (4)$$

where for n=1, the numerator is simply s, and for n>1, m=2n.

This Hs can be set independent of Co, the greater the Hs, the narrower the bandwidth for an open at $3\omega o, 5\omega o, \ldots,$ $(2n+1)\omega o$. For the FET 10 to be high power, the output impedance has a lower impedance than the load 22, with a need for a fundamental matching circuit 16 to boost the impedance. As the fundamental matching circuit 16, one may employ such a system that has an L connected to the drain of the FET 10, allowing for a dc bias supplied from the RF output terminal $N_{ORF}$. Then, for the second two-terminal reactance circuit 14, the impedance $Zs(s)$ is inductive at the angular frequency $\omega o$ of fundamental wave, and the second two-terminal reactance circuit 14 can work as part of the fundamental matching circuit 16. It is noted that this circuit can be more downsized than those to be shorted for a dc or $\omega o$.

Figure 3:
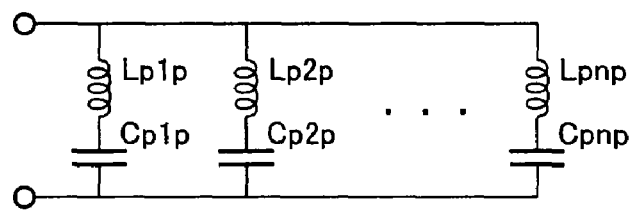
FIG. 3 is a circuit diagram of a first two-terminal reactance circuit of a configuration applicable to a class-F amplifier according to the first embodiment.

FIG. 3 is a circuit diagram of a first two-terminal reactance circuit of a configuration applicable to a class-F amplifier according to the first embodiment, as an illustrative connection diagram for the first two-terminal reactance circuit 12 having an admittance $Yp1(s)$ thereof partial fraction developed.

For n=1 and n=2 to be practical at high frequencies, respective inductances and capacitances are listed in Table 1 below. The efficiency can be set higher in the case of n=2 to be shorted for $2\omega o$ and $4\omega o$, and open for $3\omega o$ and $5107$ o, than the case of n=1 to be shorted for $2107$ o, and open for $3107$ o, while for n=2, the total sum of inductances $\Sigma(Lpip)$ becomes approximately 1.5 times that for n=1, and the total sum of capacitances $\Sigma(Cpip)$, approximately 2 times, thus resulting in a greater harmonic processor. It is noted that partial fractions can be likewise developed also for n=3 or more.

[Table 1]

TABLE 1

Partial fraction development of $Yp1(s)$ for first two-terminal reactance circuit

|  | n = 1 | n = 2 |
|---|---|---|
| Lp1p | $1/(5\omega o^2 Co) = 0.2/(\omega o^2 Co)$ | $4/(35\omega o^2 Co) = 0.114/(\omega o^2 Co)$ |
| Cp1p | $5Co/4 = 1.25Co$ | $35Co/16 = 2.19Co$ |
| Lp2p | — | $4/(21\omega o^2 Co) = 0.190/(\omega o^2 Co)$ |
| Cp2p | — | $21Co/64 = 0.328Co$ |
| $\Sigma(Lpip)$ | $1/(5\omega o^2 Co) = 0.2/(\omega o^2 Co)$ | $327(105\omega o^2 Co) = 0.305/(\omega o^2 Co)$ |
| $\Sigma(Cpip)$ | $5Co/4 = 1.25Co$ | $161Co/64 = 2.52Co$ |

Figure 4:
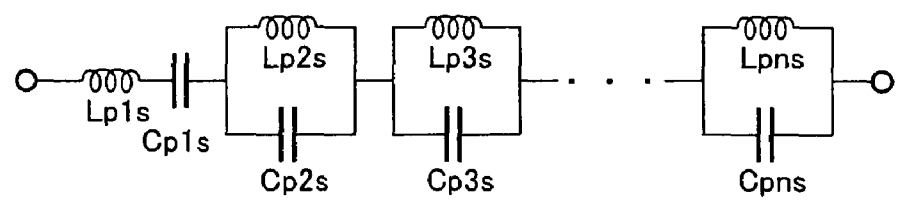
FIG. 4 is a circuit diagram of a first two-terminal reactance circuit of another configuration applicable to a class-F amplifier according to the first embodiment.

FIG. 4 is a circuit diagram of a first two-terminal reactance circuit of another configuration applicable to a class-F amplifier according to the first embodiment, as an illustrative connection diagram for the first two-terminal reactance circuit 12 having an impedance $Zp1(s)=1/Yp1(s)$ thereof partial fraction developed.

For n=1 and n=2 to be practical at high frequencies, respective inductances and capacitances are listed in Table 2 below. For n=1, they are like in Table 1. For n=2, the total sum of inductances $\Sigma(Lpis)$ becomes approximately 0.4 times that for n=1, and the total sum of capacitances $\Sigma(Cpis)$, approximately 6 times, and in cases, for example, the magnitude of inductance is dominant, the harmonic processor can be more downsized for n=2 to be high power. It is noted that partial fractions can be likewise developed also for n=3 or more.

[Table 2]

TABLE 2

Partial fraction development of $Zp1(s)$ for first two-terminal reactance circuit

|  | n = 1 | n = 2 |
|---|---|---|
| Lp1s | $1/(5\omega o^2 Co) = 0.2/(\omega o^2 Co)$ | $1/(14\omega o^2 Co) = 0.0714/(\omega o^2 Co)$ |
| Cp1s | $5Co/4 = 1.25Co$ | $161Co/64 = 2.52Co$ |
| Lp2s | — | $135/(7406\omega o^2 Co) = 0.0182/(\omega o^2 Co)$ |
| Cp2s | — | $644Co/135 = 4.77Co$ |
| $\Sigma(Lpis)$ | $1/(5\omega o^2 Co) = 0.2/(\omega o^2 Co)$ | $332/(3703\omega o^2 Co) = 0.0897/(\omega o^2 Co)$ |
| $\Sigma(Cpis)$ | $5Co/4 = 1.25Co$ | $62951Co/8640 = 7.29Co$ |

Figure 5:
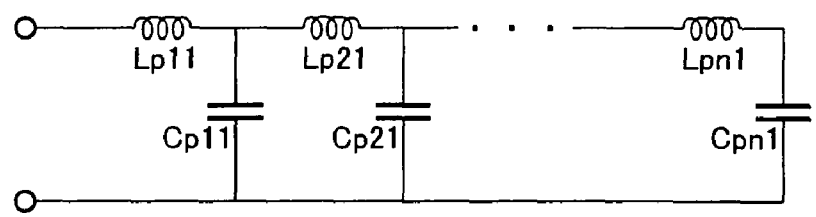
FIG. 5 is a circuit diagram of a first two-terminal reactance circuit of still another configuration applicable to a class-F amplifier according to the first embodiment.

FIG. 5 is a circuit diagram of a first two-terminal reactance circuit of still another configuration applicable to a class-F amplifier according to the first embodiment, as an illustrative connection diagram for the first two-terminal reactance circuit 12 having an impedance $Zp1(s)=1/Yp1(s)$ thereof continued fraction developed.

For n=1 and n=2 to be practical at high frequencies, respective inductances and capacitances are listed in Table 3 below. For n=1, they are like in Table 1 or Table 2. The efficiency can be set higher in the case of n=2 to be shorted for $2\omega o$ and $4\omega o$, and open for $3\omega o$ and $5\omega o$, than the case of n=1 to be shorted for $2\omega o$, and open for $3\omega o$, while for n=2, the total sum of inductances $\Sigma(Lpil)$ becomes approximately 1.1 times that for n=1, and the total sum of capacitances $\Sigma(Cpil)$, approximately 2 times, thus resulting in a greater harmonic processor. It is noted that continued fractions can be likewise developed also for n=3 or more.

[Table 3]

TABLE 3

Continued fraction development of $Zp1(s)$ for first two-terminal reactance circuit

|  | n = 1 | n = 2 |
|---|---|---|
| Lp1l | $1/(5\omega o^2 Co) = 0.2/(\omega o^2 Co)$ | $1/(14\omega o^2 Co) = 0.0714/(\omega o^2 Co)$ |
| Cp1l | $5Co/4 = 1.25Co$ | $28Co/17 = 1.65Co$ |
| Lp2l | — | $289/(1890\omega o^2 Co) = 0.153/(\omega o^2 Co)$ |
| Cp2l | — | $945Co/1088 = 0.869Co$ |
| $\Sigma(Lpil)$ | $1/(5\omega o^2 Co) = 0.2/(\omega o^2 Co)$ | $212/(945\omega o^2 Co) = 0.224/(\omega o^2 Co)$ |
| $\Sigma(Cpil)$ | $5Co/4 = 1.25Co$ | $161Co/64 = 2.52Co$ |

For the first two-terminal reactance circuit 12, $\Sigma(Lpij)$ and $\Sigma(Cpij)$ for n=2 are listed in Table 4 below (for i=1, 2; j=p, s, l). For inductance, the value of $\Sigma(Lpij)$ is smaller in Table 2 for partial fraction development of $Zp1(s)$. On the other hand, for capacitance, the value of $\Sigma(Cpij)$ is smaller in Table 1 for partial fraction development of $Yp1(s)$ or Table 3 for continued fraction development of $Zp1(s)$.

[Table 4]

TABLE 4

Comparison in first two-terminal reactance circuit (n = 2)

|  | Partial fraction development of $Yp1(s)$, Table 1 | Partial fraction development of $Zp1(s)$, Table 2 | Continued fraction development of $Zp1(s)$, Table 3 |
|---|---|---|---|
| $\Sigma(Lpij)$ | $0.305/(\omega o^2 Co)$ | $0.0897/(\omega o^2 Co)$ | $0.224/(\omega o^2 Co)$ |
| $\Sigma(Cpij)$ | $2.52Co$ | $7.29Co$ | $2.52Co$ |

Figure 6:
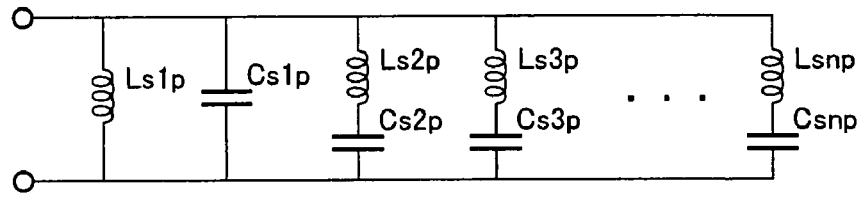
FIG. 6 is a circuit diagram of a second two-terminal reactance circuit of a configuration applicable to a class-F amplifier according to the first embodiment.

FIG. 6 is a circuit diagram of a second two-terminal reactance circuit of a configuration applicable to a class-F amplifier according to the first embodiment, as an illustrative connection diagram for the second two-terminal reactance circuit 14 having an admittance $Ys(s)=1/Zs(s)$ thereof partial fraction developed.

For n=1 and n=2 to be practical at high frequencies, respective inductances and capacitances are listed in Table 5 below. The efficiency can be set higher in the case of n=2 to be shorted for 2ωo and 4ωo, and open for 3ωo and 5ωo, than the case of n=1 to be shorted for 2ωo, and open for 3ωo. On the other hand, for n=2, the total sum of inductances $\Sigma(Lsip)$ becomes approximately 3 times that for n=1, and the total sum of capacitances $\Sigma(Csip)$, approximately 1.3 times, thus resulting in a greater harmonic processor. It is noted that partial fractions can be likewise developed also for n=3 or more.

[Table 5]

TABLE 1

Partial fraction development of Ys(s) for second two-terminal reactance circuit

|  | n = 1 | n = 2 |
|---|---|---|
| Ls1p | $Hs/(9\omega o^2) = 0.111Hs/\omega o^2$ | $16Hs/(225\omega o^2) = 0.0711Hs/\omega o^2$ |
| Cs1p | 1/Hs | 1/Hs |
| Ls2p | — | $16Hs/(63\omega o^2) = 0.254Hs/\omega o^2$ |
| Cs2p | — | 63/(256Hs) = 0.246/Hs |
| $\Sigma(Lsip)$ | $Hs/(9\omega o^2) = 0.111Hs/\omega o^2$ | $512Hs/(1575\omega o^2) = 0.325Hs/\omega o^2$ |
| $\Sigma(Csip)$ | 1/Hs | 319/(256Hs) = 1.25/Hs |

Figure 7:
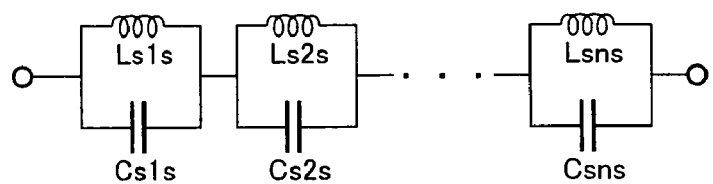
FIG. 7 is a circuit diagram of a second two-terminal reactance circuit of another configuration applicable to a class-F amplifier according to the first embodiment.

FIG. 7 is a circuit diagram of a second two-terminal reactance circuit of another configuration applicable to a class-F amplifier according to the first embodiment, as an illustrative connection diagram for the second two-terminal reactance circuit 14 having an impedance Zs(s) thereof partial fraction developed.

For n=1 and n=2 to be practical at high frequencies, respective inductances and capacitances are listed in Table 6 below. For n=1, they are like in Table 5. For n=2, the total sum of inductances $\Sigma(Lsis)$ becomes approximately 0.6 times that for n=1, and the total sum of capacitances $\Sigma(Csis)$, approximately 4 times, and in cases, for example, the magnitude of inductance is dominant, the harmonic processor can be more downsized for n=2 to be high power. It is noted that partial fractions can be likewise developed also for n=3 or more.

[Table 6]

TABLE 6

Partial fraction development of Zs(s) for second two-terminal reactance circuit

|  | n = 1 | n = 2 |
|---|---|---|
| Ls1s | $Hs/(9\omega o^2) = 0.111Hs/\omega o^2$ | $7Hs/(144\omega o^2) = 0.0486Hs/\omega o^2$ |
| Cs1s | 1/Hs | 16/(7Hs) = 2.29/Hs |
| Ls2s | — | $9Hs/(400\omega o^2) = 0.0225Hs/\omega o^2$ |
| Cs2s | — | 16/(9Hs) = 1.78/Hs |
| $\Sigma(Lsis)$ | $Hs/(9\omega o^2) = 0.111Hs/\omega o^2$ | $16Hs/(225\omega o^2) = 0.0711Hs/\omega o^2$ |
| $\Sigma(Csis)$ | 1/Hs | 256/(63Hs) = 4.06/Hs |

Figure 8:
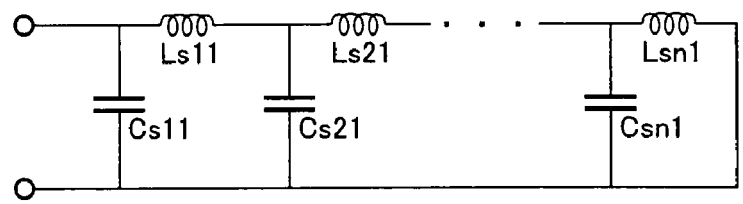
FIG. 8 is a circuit diagram of a second two-terminal reactance circuit of still another configuration applicable to a class-F amplifier according to the first embodiment.

FIG. 8 is a circuit diagram of a second two-terminal reactance circuit of still another configuration applicable to a class-F amplifier according to the first embodiment, as an illustrative connection diagram for the second two-terminal reactance circuit 14 having an impedance Ys(s)=1/Zs(s) thereof continued fraction developed.

For n=1 and n=2 to be practical at high frequencies, respective inductances and capacitances are listed in Table 7 below. For n=1, they are like in Table 5 or Table 6. For n=2, the total sum of inductances $\Sigma(Lsil)$ becomes approximately 0.6 times that for n=1, and the total sum of capacitances $\Sigma(Csil)$, approximately 6 times, and in cases, for example, the magnitude of inductance is dominant, the harmonic processor can be more downsized for n=2 to be high power. It is noted that continued fractions can be likewise developed also for n=3 or more.

[Table 7]

TABLE 7

Continued fraction development of Ys(s) for second two-terminal reactance circuit

|  | n = 1 | n = 2 |
|---|---|---|
| Ls1l | $Hs/(9\omega o^2) = 0.111Hs/\omega o^2$ | $Hs/(18\omega o^2) = 0.0556Hs/\omega o^2$ |
| Cs1l | 1/Hs | 1/Hs |
| Ls2l | — | $7Hs/(450\omega o^2) = 0.0156Hs/\omega o^2$ |
| Cs2l | — | 36/(7Hs) = 5.14/Hs |
| $\Sigma(Lsil)$ | $Hs/(9\omega o^2) = 0.111Hs/\omega o^2$ | $16Hs/(225\omega o^2) = 0.0711Hs/\omega o^2$ |
| $\Sigma(Csil)$ | 1/Hs | 43/(7Hs) = 6.14/Hs |

For the second two-terminal reactance circuit 14, $\Sigma(Lsij)$ and $\Sigma(Csij)$ for n=2 are listed in Table 8 below (for i=1, 2; j=p, s, l). For inductance, the value of $\Sigma(Lsij)$ is smaller in Table 6 for partial fraction development of Zs(s) or Table 7 for continued fraction development of Ys(s). On the other hand, for capacitance, the value of $\Sigma(Csij)$ is smaller in Table 5 for partial fraction development of Ys(s).

[Table 8]

TABLE 8

Comparison in second two-terminal reactance circuit (n = 2)

|  | Partial fraction development of Ys(s), Table 5 | Partial fraction development of Zs(s), Table 6 | Continued fraction development of Ys(s), Table 7 |
|---|---|---|---|
| $\Sigma(Lsij)$ | $0.325Hs/\omega o^2$ | $0.0711Hs/\omega o^2$ | $0.0711Hs/\omega o^2$ |
| $\Sigma(Csij)$ | 1.25/Hs | 4.06/Hs | 6.14/Hs |

Figure 9:
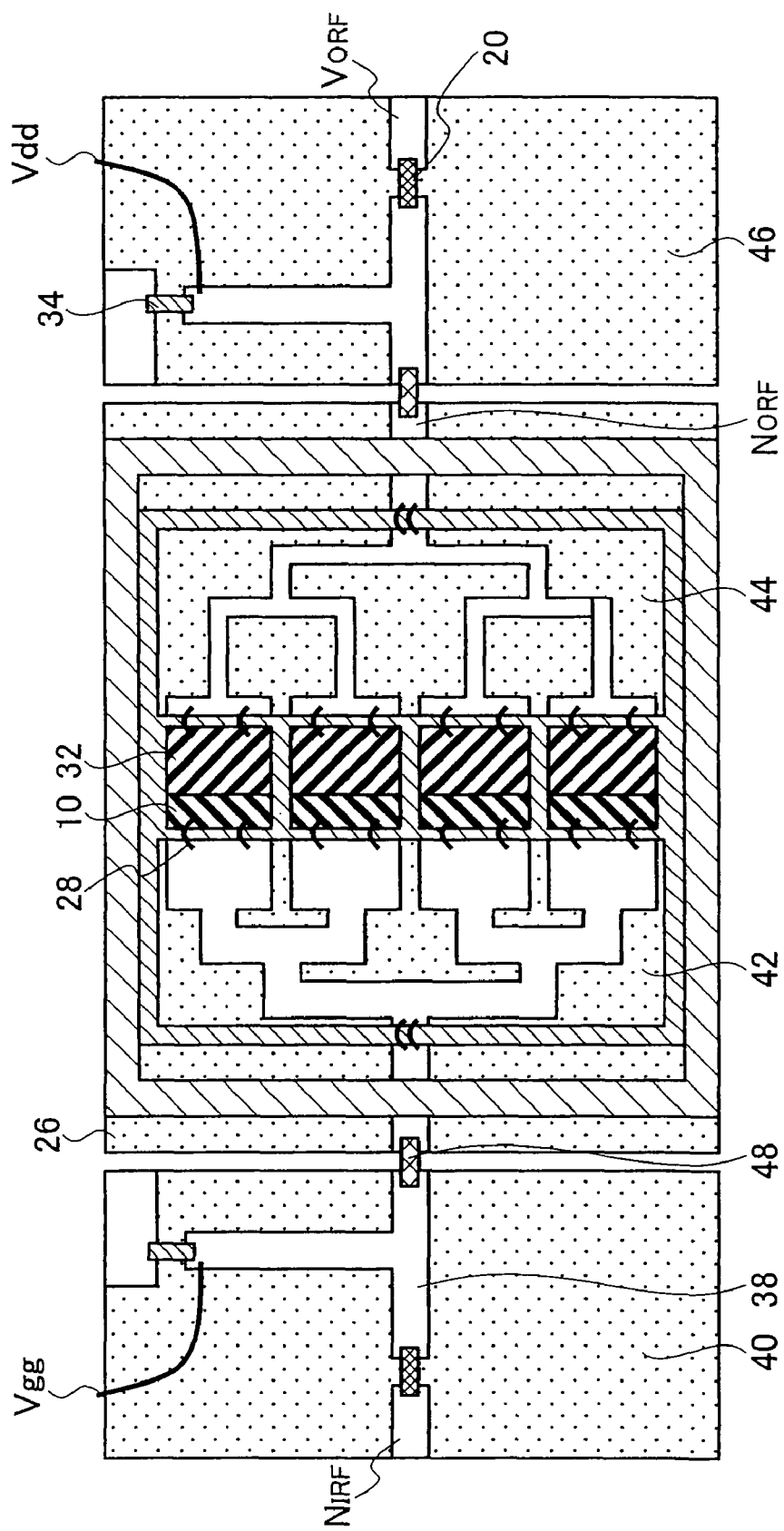
FIG. 9 is an exemplary schematic circuit pattern of internally matched high-power FETs implemented in a class-F amplifier according to the first embodiment.

FIG. 9 is an exemplary schematic circuit pattern of internally matched high-power FETs implemented in a class-F amplifier according to the first embodiment.

An input portion includes, as illustrated in FIG. 9, a micro strip line 38 connected to an RF input terminal $N_{IRF}$ and supplied with a gate voltage Vgg, and input end external circuitry 40, while the micro strip line 38 is connected via an enclosure lead 48 to an FET portion.

As illustrated in FIG. 9, the FET portion is enclosed by an enclosure 26, and includes input gate end fundamental matching circuits 42 connected to the micro strip line 38, FETs 10 having their gate electrodes connected via bonding wires (BW) 28 to the input gate end fundamental matching circuits 42, harmonic processors 32 connected to drain electrodes of the FETs 10, and output drain end fundamental matching circuits 44 connected to the harmonic processors 32, and the output drain end fundamental matching circuits 44 are connected to an RF output terminal $N_{ORF}$.

As illustrated in FIG. 9, an output portion has a dc bias Vdd supplied to a micro strip line connected to the RF output terminal $N_{ORF}$. The micro strip line provides an RF output voltage $V_{ORF}$ through a dc cutting capacitor 20, and a path capacitor 34 is connected to the micro strip line.

FIG. 9 illustrates an example of combination of internally matched high power FETs, where harmonic processors 32 are integrated on a chip of FETs 10. The harmonic processors 32 may well be formed on a separate substrate, unless parasitic reactance comes to an issue. There may also be a configuration having inductors and capacitors assembled as individual parts.

However, for high power at high frequencies, withstand voltage of capacitor or current capacity of inductor may constitute a bar for the harmonic processors 32 to be small enough relative to wavelength, so that parasitic capacitance of inductor or parasitic inductance of capacitor may be unnegligible. In such a case, it is effective to integrate at least a section of harmonic processors 32 with a chip of FETs 10 to constitute an MMIC (Monolithic Microwave Integrated Circuit), or employ an MEMS (Micro Electro Mechanical System) having a high Q value of circuit.

For example, assuming a ground inductance of via hole of MMIC as unnegligible for the first two-terminal reactance circuit 12, if n=2, there might be two via holes as necessary for the circuit configuration of FIG. 3 which requires a ground inductance of via hole to be included individually in Lp1p and Lp2p, while in use of circuit configuration illustrated in FIG. 4 or FIG. 5 one might do with a single via hole by inclusion of a ground inductance of via hole in, among others, Lp1s or Lp1l.

To this point, for a microchip capacitor mounted on a grounded surface, no ground inductance becomes an issue. By the way, although in circuit configurations such as FIG. 4 and FIG. 5 the wiring pattern to be connected to a drain can be a single to be, among others, Lp1s or Lp1l, the circuit configuration of FIG. 3 does need a pair being Lp1p and Lp2p, whether put via Cpip (i=1, 2) or not, with an increased difficulty of layout.

Anyhow, for e.g. n=2, there are three options (FIGS. 3 to 5) for the first two-terminal reactance circuit 12, and additional three (FIGS. 6 to 8) for the second two-terminal reactance circuit 14, with a total of nine combinations available, allowing for an optimal circuit selection in consideration of kind, size, parasitic reactance, layout, and the like of inductor, capacitor, etc.

For a class-F amplifier according to the present embodiment, the FET in use may be a junction type, Schottky type, or MIS (Metal Insulator Semiconductor) type.

The amplifying element is not limited to an FET, and may well be an amplifying element else, such as a HEMT, LDMOS (Lateral Doped Metal-Oxide-Semiconductor Field Effect Transistor), or HBT.

Constituent material of FET may not simply be silicon, but also GaN, InP, SiGe, SiC, GaAs, or diamond. For HBT, for example, GaAlN/GaN and the like are applicable.

According to the present embodiment, a class-F amplifier is adapted for a dc bias to be supplied from an RF output terminal, allowing for a downsizing, and a class-F operation even at high frequencies where the output capacity of FET is unnegligible, and for a high efficiency.

Second Embodiment

Figure 10:
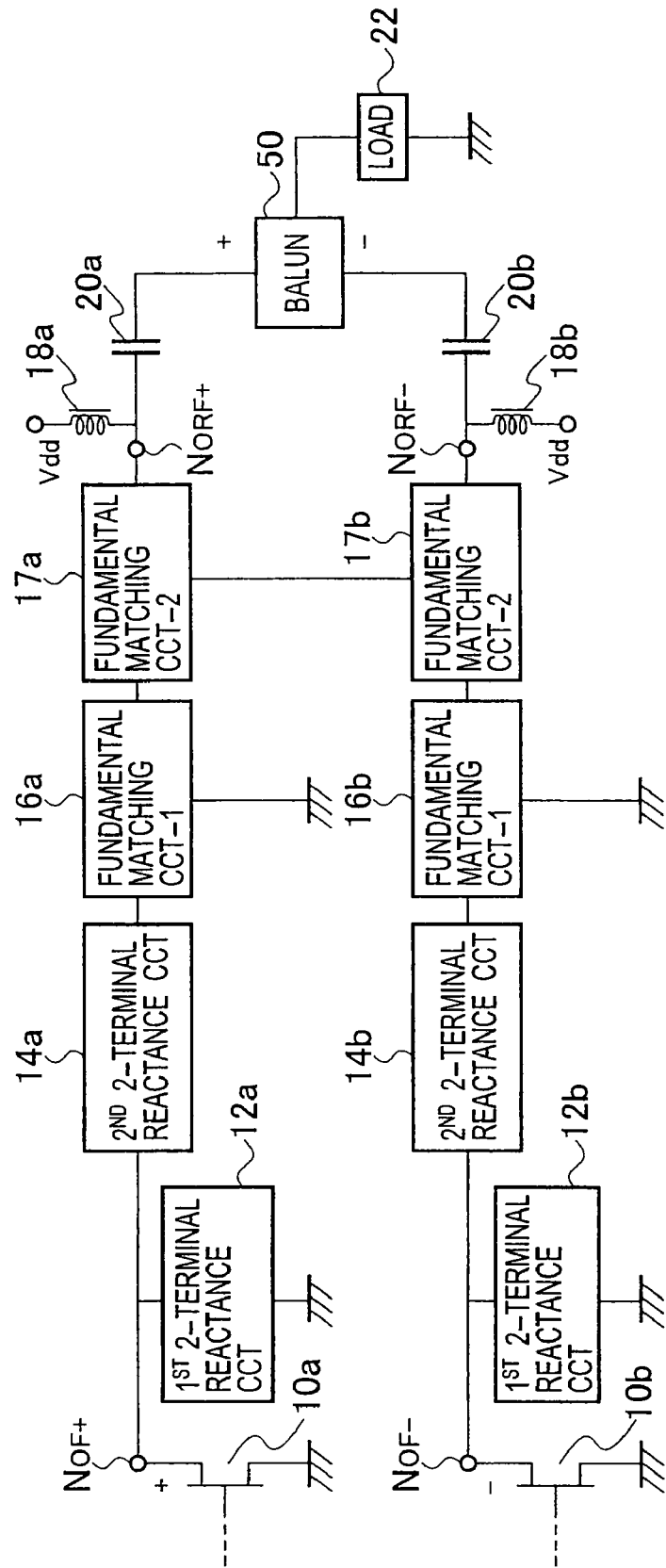
FIG. 10 is a schematic circuit diagram of a class-F amplifier according to a second embodiment of the present invention.

FIG. 10 is a schematic circuit diagram of a class-F amplifier according to a second embodiment of the present invention.

In the second embodiment, as illustrated in FIG. 10, for a push-pull amplifier having a pair of FETs 10a and 10b mutually phase-reversed to operate for power synthesis by a balun 50, pairs of fundamental matching circuits are provided, of which at least one has ground terminals floated from a ground and connected to each other between the paired FETs 10a and 10b, like a pair of fundamental matching circuits-2 17a and 17b.

As illustrated in FIG. 10, the class-F amplifier according to the second embodiment includes, as components in phase: the FET 10a, which is configured to output an output signal including a component of an angular frequency $\omega o$ of an input signal, and harmonic components thereof; a first two-terminal reactance circuit 12a interconnecting an output terminal $N_{OF+}$ and a ground terminal of the FET 10a; the fundamental matching circuit-2 17a, which is connected to an RF output terminal $N_{ORF+}$; and a combination of a second two-terminal reactance circuit 14a and a fundamental matching circuit-1 16a, that is connected in series between the output terminal $N_{OF+}$ of the FET 10a and the RF output terminal $N_{ORF+}$, interconnecting the output terminal $N_{OF+}$ of the FET 10a and an input terminal of the fundamental matching circuit-2 17a.

As illustrated in FIG. 10, the class-F amplifier according to the second embodiment further includes, as components in reverse phase: the FET 10b, which is configured to output an output signal including a component of the angular frequency $\omega o$ of input signal, and harmonic components thereof; another first two-terminal reactance circuit 12b interconnecting an output terminal $N_{OF-}$ and a ground terminal of the FET 10b; the fundamental matching circuit-2 17b, which is connected to another RF output terminal $N_{ORF-}$; and a combination of another second two-terminal reactance circuit 14b and another fundamental matching circuit-1 16b, that is connected in series between the output terminal $N_{OF-}$ of the FET 10b and the RF output terminal $N_{ORF-}$, interconnecting the output terminal $N_{OF-}$ of the FET 10b and an input terminal of the fundamental matching circuit-2 17b.

The fundamental matching circuits-2 17a and 17b have output terminals thereof connected to the output terminal $N_{OF+}$ and the output terminal $N_{OF-}$, respectively. The output terminal $N_{OF+}$ and the output terminal $N_{OF-}$ are connected, through dc cutting capacitors 20a and 20b, respectively, to the balun 50, and an output terminal of the balun 50 is connected to a ground terminal via a load 22, which provides an output signal of the push-pull amplifier.

The FET 10a has as its output impedance an impedance of a parallel circuit composed of an output resistor Ro and an output capacitor Co, like in FIG. 2. The first two-terminal reactance circuit 12a is configured to be open for a dc component, shorted for components of angular frequencies $2\omega o$, $4\omega o, \ldots, 2n\omega o$, and parallel resonant with the output capacitor Co of the FET 10a for components of angular frequencies $3\omega o, 5\omega o, \ldots, (2n+1)\omega o$. The second two-terminal reactance circuit 14a is configured to be shorted for a dc component, and open for components of angular frequencies $3\omega o, 5\omega o, \ldots, (2n+1)\omega o$.

Likewise, the FET 10b has as its output impedance an impedance of a parallel circuit composed of an output resistor Ro and an output capacitor Co. The first two-terminal reactance circuit 12b is configured to be open for a dc component, shorted for components of angular frequencies $2\omega o$, $4\omega o, \ldots, 2n\omega o$, and parallel resonant with the output capacitor Co of the FET 10b for components of angular frequencies $3\omega o, 5\omega o, \ldots, (2n+1)\omega o$. The second two-terminal reactance circuit 14b is configured to be shorted for a dc component, and open for components of angular frequencies $3\omega o, 5\omega o, \ldots, (2n+1)\omega o$.

A drain of the FET 10a is employed as the output terminal $N_{OF+}$ of the FET 10a. The first two-terminal reactance circuit 12a interconnects the drain and the ground terminal, and the second two-terminal reactance circuit 14a interconnects the drain and the input terminal of the fundamental matching circuit-1 16a. The fundamental matching circuit-2 17a has the RF output terminal $N_{ORF+}$ as its output terminal, and a combination of choke coil 18a and dc cutting capacitor 20a is inserted between the RF output terminal $N_{ORF+}$ and the load 22, with the balun 50 in between. The fundamental matching circuit-2 17a may be removed at least in part to the load.

Likewise, a drain of the FET 10*b* is employed as the output terminal $N_{OF\_}$ of the FET 10*b*. The first two-terminal reactance circuit 12*b* interconnects the drain and the ground terminal, and the second two-terminal reactance circuit 14*b* interconnects the drain and the input terminal of the fundamental matching circuit-1 16*b*. The fundamental matching circuit-2 17*b* has the RF output terminal $N_{ORF\_}$ as its output terminal, and a combination of choke coil 18*b* and dc cutting capacitor 20*b* is inserted between the RF output terminal $N_{ORF\_}$ and the load 22, with the balun 50 in between. The fundamental matching circuit-2 17*b* may be removed at least in part to the load.

The class-F amplifier according to the second embodiment is allowed, like the class-F amplifier according to the first embodiment, to employ for the first two-terminal reactance circuits 12*a* and 12*b* any one of circuit configurations illustrated in FIGS. 3 to 5, having corresponding circuit components in Tables 1 to 3.

The class-F amplifier according to the second embodiment is further allowed, like the class-F amplifier according to the first embodiment, to employ for the second two-terminal reactance circuits 14*a* and 14*b* any one of circuit configurations illustrated in FIGS. 6 to 8, having corresponding circuit components in Tables 5 to 7.

For a class-F amplifier according to the present embodiment, the FETs in use may be a junction type, Schottky type, or MIS (Metal Insulator Semiconductor) type.

The amplifying element is not limited to an FET, and may well be an amplifying element else, such as a HEMT, LDMOS (Lateral Doped Metal-Oxide-Semiconductor Field Effect Transistor), or HBT.

Constituent material of FET may not simply be silicon, but also GaN, InP, SiGe, SiC, GaAs, or diamond. For HBT, for example, GaAlN/GaN and the like are applicable.

According to the present embodiment, a class-F amplifier is configured as a push-pull amplifier having a couple of FETs 10*a* and 10*b* reverse-phased to operate for power synthesis by a balun 50, and is adapted for dc biases to be supplied from RF output terminals, allowing for a downsizing, and a class-F operation even at high frequencies where outputs of FETs are unnegligible, and for a high efficiency.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

INDUSTRIAL APPLICABILITY

According to the present invention, a class-F amplifier has a wide range of application fields, such as an internally matched power amplifier, a power MMIC, a microwave power amplifier, and a milliwave power amplifier.

What is claimed is:

1. A class-F amplifier comprising:
    an amplifying element configured to output an output signal including a component of an angular frequency ωo of an input signal, and harmonic components thereof;
    a first reactance circuit interconnecting an output terminal and a ground terminal of the amplifying element;
    a fundamental matching circuit disposed at an output terminal end of the amplifying element;
    a second reactance circuit connected between an input terminal of the fundamental matching circuit and the output terminal of the amplifying element; and
    a load interconnecting an output terminal of the fundamental matching circuit and a ground terminal, wherein
    the amplifying element has as an output impedance that is an impedance of a parallel circuit comprising an output resistor and an output capacitor,
    the first reactance circuit is configured to be open for a dc component, shorted for components of angular frequencies 2ωo, 4ωo, . . . , 2nωo, where n is an arbitrary integer of 1 or more, and parallel resonant with the output capacitor of the amplifying element for components of angular frequencies 3ωo, 5ωo, . . . , (2n+1)ωo,
    the second reactance circuit is configured to be shorted for a dc component, and open for components of angular frequencies 3ωo, 5ωo, . . . , (2n+1)ωo,
    the output capacitor is connected in parallel with the first reactance circuit, having a circuit having an admittance Yp(s) to be open for a dc, shorted for angular frequencies 2ωo, 4ωo, . . . , 2nωo, and open for angular frequencies 3ωo, 5ωo, . . . , (2n+1)ωo, and
    the amplifying element is a high power element that has an output impedance with a lower impedance value than the load, which narrows the bandwidth for the angular frequency ωo of fundamental wave to be matched, when the output capacity Co is large so that the bandwidth is prevented from getting narrower, the admittance Yp(s) is conditioned, in its partial fraction development: Yp(s) = Hp·s+Yp1(s) such that Hp=Co, the second term Yp1(s) represents an admittance of the first reactance circuit, the first reactance circuit gets parallel resonant with the output capacitor of the amplifying element for odd harmonics, permitting the impedance seen from the output resistor with the load inclusive to be open for odd harmonics, allowing for a class-F operation at high frequencies where the output capacitor of the amplifying element is non-negligible.

2. The class-F amplifier as claimed in claim 1, wherein the first reactance circuit comprises a circuit having n serial resonance circuits connected in parallel.

3. The class-F amplifier as claimed in claim 1, wherein the first reactance circuit comprises a circuit having (n−1) parallel resonance circuits, a single inductor, and a single capacitor connected in series.

4. The class-F amplifier as claimed in claim 1, wherein the first reactance circuit comprises a ladder circuit of n stages each having a serial inductor and a parallel capacitor.

5. The class-F amplifier as claimed in claim 1, wherein the second reactance circuit comprises a circuit having (n−1) serial resonance circuits, a single inductor, and a single capacitor connected in parallel.

6. The class-F amplifier as claimed in claim 1, wherein the second reactance circuit comprises a circuit having n parallel resonance circuits connected in series.

7. The class-F amplifier as claimed in claim 1, wherein the second reactance circuit comprises a ladder circuit of n stages each having a parallel capacitor and a serial inductor.

8. The class-F amplifier as claimed in claim 1, wherein the second reactance circuit is configured to be shorted: for a dc component for n=1; for a dc component and an angular frequency $4\omega o$ for n=2; and for a dc component and angular frequencies $4\omega o$, $6\omega o$, ..., $2n\omega o$ for n=n.

9. The class-F amplifier as claimed in claim 1, wherein the load comprises at least part of the fundamental matching circuit.

10. The class-F amplifier as claimed in claim 1, wherein the amplifying element comprises a junction gate field effect transistor.

11. The class-F amplifier as claimed in claim 1, wherein the amplifying element comprises a Schottky gate field effect transistor.

12. The class-F amplifier as claimed in claim 1, wherein the amplifying element comprises an insulated gate field effect transistor.

13. The class-F amplifier as claimed in claim 1, wherein the amplifying element comprises one of a high electron mobility field effect transistor and a hetero-junction bipolar transistor.

14. A class-F amplifier comprising a pair of class-F amplifiers, each of the class-F amplifiers comprising:

an amplifying element configured to output an output signal including a component of an angular frequency $\omega o$ of an input signal, and harmonic components thereof;

a first reactance circuit interconnecting an output terminal and a ground terminal of the amplifying element;

a fundamental matching circuit disposed at an output terminal end of the amplifying element;

a second reactance circuit connected between an input terminal of the fundamental matching circuit and the output terminal of the amplifying element; and a load interconnecting an output terminal of the fundamental matching circuit and a ground terminal, wherein the amplifying element has as an output impedance thereof an impedance of a parallel circuit comprising an output resistor and an output capacitor, the first reactance circuit is configured to be open for a dc component, shorted for components of angular frequencies $2\omega o$, $4o$, ..., $2n\omega o$, where n is an arbitrary integer of 1 or more, and parallel resonant with the output capacitor of the amplifying element for components of angular frequencies $3\omega o$, $5\omega o$, ..., $(2n+1)\omega o$, and the second reactance circuit is configured to be shorted for a dc component, and open for components of angular frequencies $3\omega o$, $5\omega o$, ..., $(2n+1)\omega o$, wherein the pair of class-F amplifiers are mutually phase-reversed for a push-pull operation for power synthesis by a balun.

15. A class-F amplifier comprising a pair of class-F amplifiers, each of the class-F amplifiers comprising:

an amplifying element configured to output an output signal including a component of an angular frequency $\omega o$ of an input signal, and harmonic components thereof;

a first reactance circuit interconnecting an output terminal and a ground terminal of the amplifying element;

a fundamental matching circuit disposed at an output terminal end of the amplifying element;

a second reactance circuit connected between an input terminal of the fundamental matching circuit and the output terminal of the amplifying element; and a load interconnecting an output terminal of the fundamental matching circuit and a ground terminal, wherein the amplifying element has as an output impedance thereof an impedance of a parallel circuit comprising an output resistor and an output capacitor, the first reactance circuit is configured to be open for a dc component, shorted for components of angular frequencies $2\omega o$, $4\omega o$, ..., $2n\omega o$, where n is an arbitrary integer of 1 or more, and parallel resonant with the output capacitor of the amplifying element for components of angular frequencies $3\omega o$, $5\omega o$, ..., $(2n+1)\omega o$, and the second reactance circuit is configured to be shorted for a dc component, and open for components of angular frequencies $3\omega o$, $5\omega o$, ..., $(2n+1)\omega o$, wherein the pair of class-F amplifiers are mutually phase-reversed for a push-pull operation for power synthesis by a balun, and include fundamental matching circuits having ground terminals floated from a ground and connected to each other.

* * * * *